US008163637B2

(12) United States Patent
Konishi et al.

(10) Patent No.: US 8,163,637 B2
(45) Date of Patent: Apr. 24, 2012

(54) FORMING IMPURITY REGIONS IN SILICON CARBIDE DEVICES

(75) Inventors: Masaki Konishi, Toyota (JP); Hirokazu Fujiwara, Nishikamo-gun (JP); Takeshi Endo, Obu (JP); Takeo Yamamoto, Aichi-gun (JP); Takashi Katsuno, Aichi-gun (JP); Yukihiko Watanabe, Aichi-gun (JP)

(73) Assignees: Toyota Jidosha Kabushiki Kaisha, Toyota-shi (JP); Denso Corporation, Kariya (JP)

( * ) Notice: Subject to any disclaimer, the term of this patent is extended or adjusted under 35 U.S.C. 154(b) by 0 days.

(21) Appl. No.: 12/975,832

(22) Filed: Dec. 22, 2010

(65) Prior Publication Data
US 2011/0151654 A1    Jun. 23, 2011

(30) Foreign Application Priority Data

Dec. 22, 2009   (JP) ................. 2009-291420

(51) Int. Cl.
*H01L 21/425*    (2006.01)
(52) U.S. Cl. ........ 438/530; 438/514; 438/330; 257/335; 257/377; 257/471; 257/E21.334; 257/E21.067

(58) Field of Classification Search .............. 438/530, 438/330, 514; 257/77, E29.104, 335, 377, 257/471, E21.334, E21.067
See application file for complete search history.

(56) References Cited

U.S. PATENT DOCUMENTS

| 6,642,577 | B2 * | 11/2003 | Yamauchi et al. ............ 257/341 |
| 2005/0253188 | A1 * | 11/2005 | Kito ............................. 257/330 |
| 2007/0032002 | A1 | 2/2007 | Nonaka et al. |
| 2009/0008651 | A1 * | 1/2009 | Okuno et al. .................. 257/77 |
| 2010/0159653 | A1 | 6/2010 | Nonaka et al. |

FOREIGN PATENT DOCUMENTS

| JP | 2000-8190 A | 1/2000 |
| JP | 2002-016013 A | 1/2002 |
| JP | 2007-042803 A | 2/2007 |

* cited by examiner

*Primary Examiner* — Kevin Parendo
*Assistant Examiner* — Wilner Jean Baptiste
(74) *Attorney, Agent, or Firm* — Kenyon & Kenyon LLP

(57) ABSTRACT

First, a first layer made of Ni or an alloy including Ni may be formed on an upper surface of a semiconductor layer. Next, a second layer made of silicon oxide may be formed on an upper surface of the first layer. Next, a part, which corresponds to a semiconductor region, of the second layer may be removed. Next, second conductive type ion impurities may be injected from upper sides of the first and second layers to the semiconductor layer after the removing step.

9 Claims, 10 Drawing Sheets

US 8,163,637 B2

FORMING IMPURITY REGIONS IN SILICON CARBIDE DEVICES

CROSS-REFERENCE TO RELATED APPLICATION

This application claims priority to Japanese Patent Application No. 2009-291420 filed on Dec. 22, 2009, the contents of which are hereby incorporated by reference into the present application.

TECHNICAL FIELD

The present application relates to a method for manufacturing a semiconductor device. Specifically, the present application relates to a method for manufacturing a SiC semiconductor device having a semiconductor layer composed of silicon carbide (SiC).

DESCRIPTION OF RELATED ART

SiC semiconductor devices are being developed in an attempt to enhance the performance of semiconductor devices. In one such SiC semiconductor device, a second conductive type semiconductor region is formed in a first conductive type semiconductor layer, and is exposed at a part of an upper surface of the first conductive type semiconductor layer. For example, in a field-effect transistor disclosed in Japanese Patent Application Publication No. 2007-42803, a p type semiconductor region is formed on an n type semiconductor layer such that the p type semiconductor region is exposed at a part of an upper surface of the n type semiconductor layer. In order to manufacture such a semiconductor device, normally, ion impurities are injected into a part of a semiconductor layer via a mask to form a second conductive type semiconductor region on a first conductive type semiconductor layer.

SUMMARY

With a SiC semiconductor device, since ion impurities have a small thermal diffusion coefficient, the ion impurities cannot be diffused in a semiconductor layer using a thermal diffusion method. Therefore, an ion injection method is used. Thus, when forming a semiconductor region to a predetermined depth from a surface of a semiconductor layer using an ion injection method, ion impurities must be injected into the semiconductor layer using high energy. Therefore, in a method for manufacturing a SiC semiconductor device, a silicon oxide ($SiO_2$) film that is highly capable of shielding ion impurities is generally used as an ion impurity injection mask.

However, a conventional method in which a silicon oxide film is used as an ion impurity injection mask creates the following problem. That is, in a conventional method, as illustrated in FIG. 16, a silicon oxide film 54 and a resist film 56 are first formed on an upper surface of a semiconductor layer 52. Next, as illustrated in FIG. 17, a part of the resist film 56 is removed to form an opening 58 and the silicon oxide film 54 is removed using the resist film 56 as a mask. Dry etching such as reactive ion etching is used to remove the silicon oxide film 54. However, when removing the silicon oxide film 54 by dry etching, it is difficult to uniformly remove the silicon oxide film 54 within a plane. In other words, thick parts and thin parts may be created in the silicon oxide film 54. Therefore, overetching is performed in order to completely remove the silicon oxide film 54 and surely open a part corresponding to the semiconductor region. As a result, as illustrated in FIG. 17, a difference in level may be formed on the upper surface of the semiconductor layer 52. In other words, a difference in level may be formed between an upper surface 52b of a part covered by the silicon oxide film 54 and an upper surface 52a of a part where the opening 58 is formed. In addition, since ion impurities are subsequently injected in a state where the difference in level is formed, as illustrated in FIG. 18, a difference in level is formed between the upper surface 52b of the semiconductor layer 52 and an upper surface 59a of a semiconductor region 59. Such a difference in level causes field concentration and degrades characteristics of the semiconductor device.

Moreover, Japanese Patent Application Publication No. 2007-42803 discloses a method in which a thin silicon oxide film is formed on an upper surface of a semiconductor layer, whereby ion impurities are injected through the silicon oxide film. Specifically, as illustrated in FIG. 19, a silicon oxide film 60, a metallic layer 62 (e.g., molybdenum (Mo) or tungsten (W)), and a silicon oxide film 64 are formed on an upper surface of a semiconductor layer 52, the metallic layer 62 is etched using the silicon oxide film 64 as a mask, and ion impurities are injecting using the etched metallic layer 62 as an impurity injection mask. With this method, since the silicon oxide film 60 is formed on the upper surface of the semiconductor layer 52, when etching the metallic layer 62, etching of the upper surface of the semiconductor layer 52 can be prevented. However, since dry etching is used to etch the metallic layer 62, the silicon oxide film 60 is also etched by the dry etching. As described above, it is difficult to uniformly remove the silicon oxide film in a plane using dry etching. Therefore, dry etching of the metallic layer 62 creates thick parts and thin parts in the silicon oxide film 60, and in some cases, parts may be created where the silicon oxide film 60 is entirely removed. Once the silicon oxide film 60 is entirely removed, a difference in level is to be created on an upper surface 59a of a semiconductor region 59. As shown, a semiconductor region whose upper surface is free of differences in level cannot be stably formed by the method according to Japanese Patent Application Publication No. 2007-42803. Moreover, with the method according to Japanese Patent Application Publication No. 2007-42803, when ion impurities are injected in a state where thick parts and thin parts have been created on in the silicon oxide film 60, a stop depth of the ion impurities is to vary within the plane, causing the depth of the semiconductor region 59 to vary within the plane.

It is an object of the present teachings to provide a technique for a SiC semiconductor device including a first conductive type semiconductor layer, the first conductive type semiconductor layer having a second conductive type semiconductor region exposed at a part of an upper surface of the first conductive type semiconductor layer, wherein a difference in level is not formed between the upper surface of the semiconductor layer and an upper surface of the semiconductor region and, at the same time, a semiconductor region whose upper surface is free of differences in level can be stably formed.

In one aspect of the present teachings, a manufacturing method for manufacturing a semiconductor device including a first conductive type semiconductor layer composed of silicon carbide, the first conductive type semiconductor layer having a second conductive type semiconductor region exposed at a part of an upper surface of the first conductive type semiconductor layer, may comprise a first layer forming step, a second layer forming step, a removing step, and an ion impurity injecting step. In the first layer forming step, a first layer made of Ni or an alloy including Ni may be formed on the upper surface of the semiconductor layer. In the second layer forming step, a second layer made of silicon oxide may be formed on an upper surface of the first layer formed in the first layer forming step. In the removing step, a part of the second layer formed in the second layer forming step may be removed. The part of the second layer corresponds to the second conductive type semiconductor region. In the ion impurity injecting step, second conductive type ion impurities are injected from upper sides of the first and second layers to the first conductive type semiconductor layer after the removing step.

In this manufacturing method, the first layer (Ni or an alloy including Ni) and the second layer (silicon oxide) are formed on the upper surface of the first conductive type semiconductor layer and a part of the second layer is removed to form an opening at a part where the second conductive type semiconductor region is formed. Next, the ion impurities are injected to the first conductive type semiconductor layer through the first layer while using the second layer as an impurity injection mask. By injecting the ion impurities through the first layer, a difference in level can be prevented from forming between the upper surface of the first conductive type semiconductor layer and the upper surface of the second conductive type semiconductor region. In addition, since Ni or an alloy including Ni is used as the first layer and silicon oxide is used as the second layer, the first layer is hardly removed when removing a part of the second layer to form the opening. Therefore, the thickness of the first layer can be accurately controlled and, as a result, a second conductive type semiconductor region whose upper surface is free of differences in level can be stably formed.

Here, the "first conductor type" and the "second conductor type" signify either an n type or a p type. In other words, when the "first conductor type" is the n type, the "second conductor type" is the p type; alternatively, when the "first conductor type" is the p type, the "second conductor type" is the n type.

In the manufacturing method described above, the first conductive type semiconductor layer may be arranged as an n type semiconductor layer and the second conductive type semiconductor region may be arranged as a p type semiconductor region. In this case, Al ions may be injected in the ion impurity injecting step. Consequently, a p type semiconductor region can be formed on an n type semiconductor layer. In addition, by having Al ions injected toward the semiconductor layer collide with first layer metal atoms (Ni), the first layer metal atoms (Ni) can also be injected into the first conductive type semiconductor layer.

Furthermore, the manufacturing method described above may further comprise an annealing step in which Al ions injected into the first conductive type semiconductor layer in the ion impurity injecting step are activated. In this case, when the annealing step is executed in a state where the first layer metal atoms (Ni) have been injected into the semiconductor layer, siliciding of the first layer metal atoms (Ni) injected into the semiconductor layer occur. Consequently, when an electrode is provided on the p type semiconductor region, a contact resistance of the electrode and the p type semiconductor region can be reduced.

Moreover, in the manufacturing method described above, a thickness of the first layer may be set equal to or less than 100 nm. Adopting such a configuration enables the ion impurities to be injected down to a sufficient depth even when Ni or an alloy including Ni is used as the first layer.

In another aspect of the present teachings, a manufacturing method for manufacturing a semiconductor device including a first conductive type semiconductor layer composed of silicon carbide, the first conductive type semiconductor layer having a second conductive type semiconductor region exposed at a part of an upper surface of the first conductive type semiconductor layer, may comprise a mask layer forming step, a removing step, an ion impurity injecting step, and a smoothing step. In the mask layer forming step, a mask layer may be formed on the upper surface of the first conductive type semiconductor layer. In the removing step, a part of the mask layer formed in the mask layer forming step may be removed. The part of the second layer corresponds to the second conductive type semiconductor region. In the ion impurity injecting step, second conductive type ion impurities may be injected from upper sides of the first conductive type semiconductor layer and the mask layer to the first conductive type semiconductor layer after the removing step. In the smoothing step, the upper surface of the semiconductor layer may be smoothed after the ion impurity injecting step.

In this manufacturing method, a part of the mask layer formed on the upper surface of the first conductive type semiconductor layer is removed to open the part where the second conductive type semiconductor region is to be formed, and the ion impurities are injected to the first conductive type semiconductor layer using the mask layer as the impurity injection mask. With this method, while a difference in level is formed between the upper surface of the first conductive type semiconductor layer and the upper surface of the second conductive type semiconductor region, by performing the smoothing step after ion impurity injection, the difference in level between the upper surface of the first conductive type semiconductor layer and the upper surface of the second conductive type semiconductor region can be removed. Therefore, a difference in level is not formed between the upper surface of the first conductive type semiconductor layer and the upper surface of the second conductive type semiconductor region and the second conductive type semiconductor region whose upper surface is free of differences in level can be stably formed.

In the ion impurity injecting step of the manufacturing method described above, at the part corresponding to the second conductive type semiconductor region among the first conductive type semiconductor layer, second conductive type ion impurities are preferably injected to a depth that is deeper than a thickness of the semiconductor layer removed in the smoothing step. Since ion impurities need not be injected to a portion removed in the smoothing step, the number of injections of ion impurities to be performed can be reduced.

These aspects and features may be utilized singularly or, in combination, in order to make improved manufacturing method. In addition, other objects, features and advantages of the present teachings will be readily understood after reading the following detailed description together with the accompanying drawings and claims. Of course, the additional features and aspects disclosed herein also may be utilized singularly or, in combination with the above-described aspect and features.

DETAILED DESCRIPTION OF EMBODIMENT

First Embodiment

A manufacturing method according to a first embodiment of the present teachings will now be explained. First, a semiconductor device 10 that is manufactured by the manufacturing method according to the first embodiment will be described. The semiconductor device 10 is a so-called junction barrier Schottky diode (JBS diode) in which a Schottky barrier diode structure part and a p-n diode structure part are alternately formed.

Figure 1:
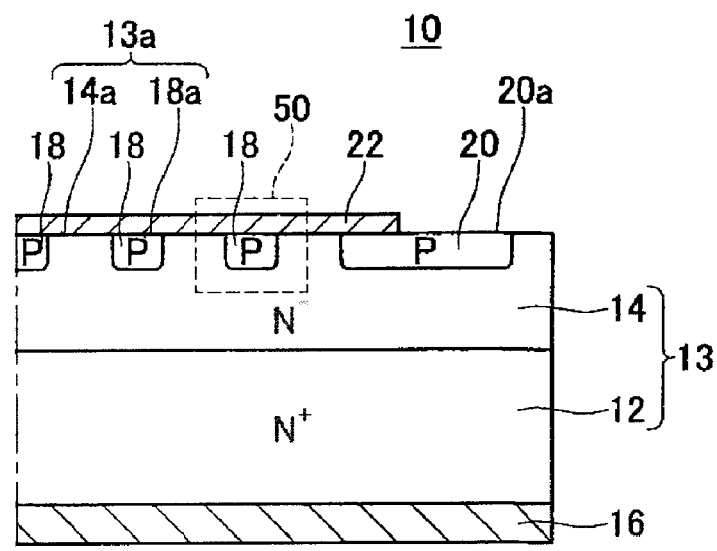
FIG. 1 is a cross-sectional view illustrating an example of a SiC semiconductor device manufactured by a manufacturing method according to a first embodiment.

As illustrated in FIG. 1, the semiconductor device 10 is foamed on a semiconductor substrate 13 composed of SiC. The semiconductor substrate 13 comprises a wafer substrate 12 and a drift layer 14 laminated on the wafer substrate 12. The wafer substrate 12 is arranged on a rear surface-side of the semiconductor substrate 13. The wafer substrate 12 is of, for example, the n type, and an impurity concentration thereof may be set to a concentration of around $1.0 \times 10^{18}$ cm$^{-3}$ to $1.0 \times 10^{21}$ cm$^{-3}$. As the wafer substrate 12, for example, an n type 4H—SiC substrate (e.g., impurity concentration: $1.0 \times 10^{19}$ cm$^{-3}$, film thickness: 350 μm) can be used.

The drift layer 14 is arranged on a front surface-side of the semiconductor substrate 13. The drift layer 14 is of the n type, and an impurity concentration thereof is set lower than the wafer substrate 12. The impurity concentration of the drift layer 14 can be set to around $1.0 \times 10^{15}$ cm$^{-3}$ to $5.0 \times 10^{16}$ cm$^{-3}$. For example, a drift layer 14 with an impurity concentration of $5.0 \times 10^{15}$ cm$^{-3}$ and a film thickness of 13 μm can be used. The drift layer 14 can be formed by growing an epitaxial layer on the wafer substrate 12.

A plurality of semiconductor regions 18 and a guard ring 20 are formed on the drift layer 14. The semiconductor regions 18 are p type semiconductor regions doped with a relatively high concentration of p type impurities. Each semiconductor region 18 is formed in an island shape in a range exposed at an upper surface of the drift layer 14. Therefore, the drift layer 14 and the semiconductor region 18 are alternately exposed at an upper surface 13a of the semiconductor substrate 13. As will be described later, an upper surface 14a of the drift layer 14 and an upper surface 18a of the semiconductor region 18 are positioned on the same plane and a difference in level is not created therebetween. For example, aluminum ion (Al ion) can be used as the p type impurity to be doped on the semiconductor region 18. The impurity concentration of the semiconductor region 18 can be set to around $1.0 \times 10^{17}$ cm$^{-3}$ to $1.0 \times 10^{20}$ cm$^{-3}$ and, for example, a semiconductor region 18 with an impurity concentration of $1.0 \times 10^{19}$ cm$^{-3}$ and a film thickness of 0.6 μm can be used.

The guard ring 20 is a p type semiconductor region doped with p type impurities. The guard ring 20 is formed in a range exposed at the upper surface of the drift layer 14. The guard ring 20 is formed so as to surround the plurality of semiconductor regions 18 in a plan view of the semiconductor substrate 13. For example, aluminum ion (Al ion) can be used as the p type impurity to be doped on the guard ring 20. The impurity concentration of the guard ring 20 can be set to around $1.0 \times 10^{17}$ cm$^{-3}$ to $1.0 \times 10^{20}$ cm$^{-3}$ and, for example, a guard ring 20 with an impurity concentration of $6.0 \times 10^{17}$ cm$^{-3}$ and a film thickness of 0.6 μm can be used.

A back electrode 16 is formed on the entire rear surface of the semiconductor substrate 13 (i.e., a rear surface of the wafer substrate 12). The back electrode 16 is in ohmic contact with the wafer substrate 12. The back electrode 16 may be made of, for example, Ti, Mo, Ni (nickel), and W (tungsten).

A front electrode 22 is formed on a front surface of the semiconductor substrate 13 (i.e., a front surface of the drift layer 14). The front electrode 22 comprises a Schottky electrode and a wiring electrode formed on the Schottky electrode. The Schottky electrode comes into Schottky contact with the drift layer 14. The Schottky electrode may be made of, for example, Mo (molybdenum), Ti (titanium), or Ni (nickel). The wiring electrode may be made of, for example, Al (aluminum).

In the semiconductor device 10 described above, the Schottky barrier diode structure part comprising the front electrode 22 and the drift layer 14 and the p-n diode structure part comprising the front electrode 22 and the semiconductor region 18 are alternately formed along a single direction on the substrate plane. Therefore, when a reverse voltage (i.e., a potential that causes the front electrode 22 to have a low potential) is applied to the semiconductor device 10, a depletion layer extends from a p-n junction plane between the semiconductor region 18 and the drift layer 14, causing depletion of the drift layer 14 to which the front electrode 22 is joined. Consequently, generation of leakage current at the Schottky barrier diode structure part can be prevented. On the other hand, when a forward voltage (i.e., a potential that causes the front electrode 22 to have a high potential) is applied to the semiconductor device, forward voltage drop is suppressed (in other words, a low on resistance is realized) by the Schottky barrier diode structure part.

Figure 2:
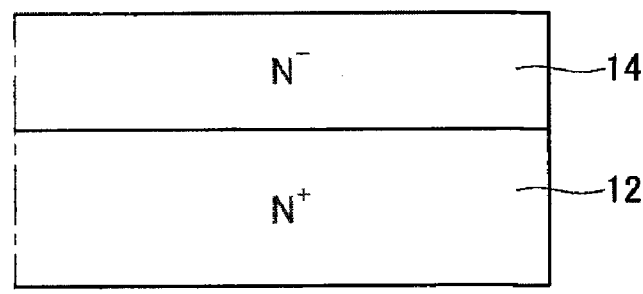
FIG. 2 is a diagram (first diagram) explaining the method for manufacturing the semiconductor device according to the first embodiment.

Next, an example of a method for manufacturing the semiconductor device 10 described above will be described with reference to FIGS. 2 to 9. First, as illustrated in FIG. 2, a 4H—SiC n type wafer substrate 12 (e.g., having a thickness of 350 μm and an impurity concentration of $1.0 \times 10^{19}$ cm$^{-3}$) is prepared and a drift layer 14 (e.g., having an impurity concentration of $5.0 \times 10^{15}$ cm$^{-3}$ and a thickness of 13 μm) is formed on the wafer substrate 12 by epitaxial growth.

Figure 3:
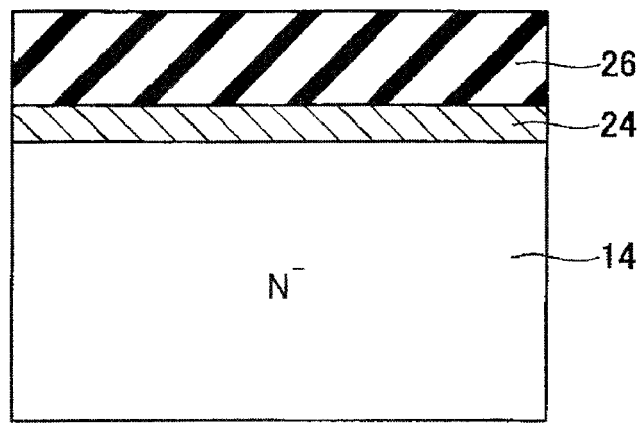
FIG. 3 is a diagram (second diagram) explaining the method for manufacturing the semiconductor device according to the first embodiment.

Subsequently, a semiconductor region 18 is formed on the drift layer 14. Specifically, as illustrated in FIG. 3, a nickel (Ni) layer 24 (e.g., 0.04 μm) is formed on an upper surface of the drift layer 14. In FIG. 3, only a region 50 enclosed by a dotted line in FIG. 1 is shown enlarged (the same applies for FIGS. 4 to 8 and FIGS. 10 to 15). The nickel layer 24 can be deposited on the upper surface of the drift layer 14 by a deposition method.

Moreover, a film thickness of the nickel layer 24 is preferably set to 100 nm or less. Specifically, a depth to which the ion impurities are injected is determined by a magnitude of energy when injecting the ion impurities and the film thickness of the nickel layer 24. Therefore, when the film thickness of the nickel layer 24 is increased, the injection energy of the ion impurities must be increased in order to maintain the same injection depth of ion impurities. However, an increase in the injection energy of the ion impurities necessitates a larger ion injection apparatus. Consequently, by setting the film thickness of the nickel layer 24 to 100 nm or less, ion impurities can be injected to a desired depth of the drift layer 14 without having to increase the size of the ion injection apparatus. Moreover, a metallic layer formed by an alloy including Ni (e.g., a Ni—Mo alloy or a Ti—Al alloy) may be provided on the upper surface of the drift layer 14.

Figure 4:
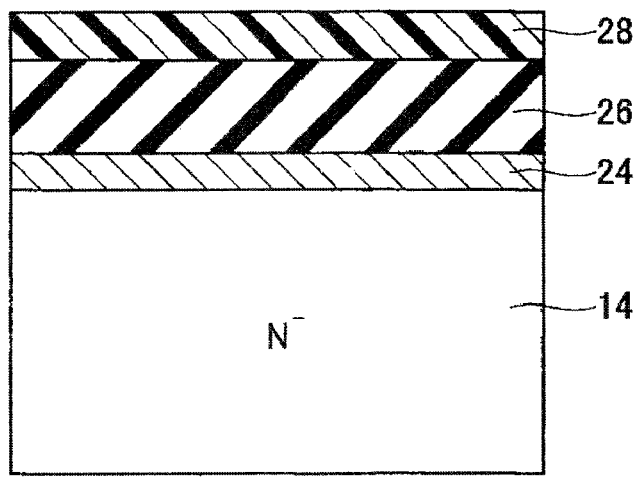
FIG. 4 is a diagram (third diagram) explaining the method for manufacturing the semiconductor device according to the first embodiment.
Figure 5:
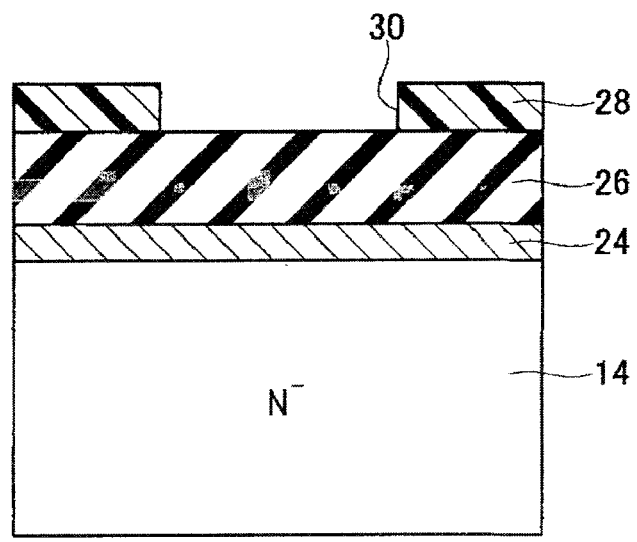
FIG. 5 is a diagram (fourth diagram) explaining the method for manufacturing the semiconductor device according to the first embodiment.

After the nickel layer 24 is formed on the upper surface of the drift layer 14, a silicon oxide film 26 (e.g., having a thickness of 2.0 μm) is formed on an upper surface of the nickel layer 24 (the state illustrated in FIG. 3). A known method such as a chemical vapor deposition method (i.e., CVD method) can be used to form the silicon oxide film 26. Next, as illustrated in FIG. 4, a resist film 28 is formed on a surface of the silicon oxide film 26. A spin coat method or the like can be used to form the resist film 28. Next, as illustrated in FIG. 5, a pattern corresponding to the semiconductor region 18 is patterned onto the resist film 28 by photolithography. Accordingly, an opening 30 corresponding to a formation position of the semiconductor region 18 is formed on the resist film 28.

Figure 6:
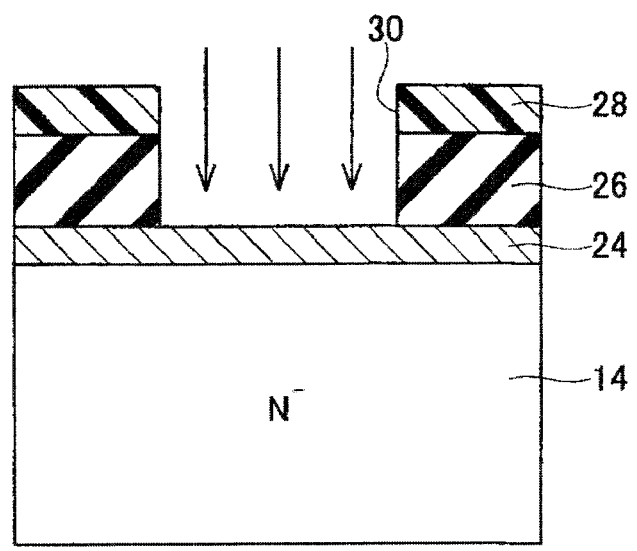
FIG. 6 is a diagram (fifth diagram) explaining the method for manufacturing the semiconductor device according to the first embodiment.

Next, as illustrated in FIG. 6, using the resist film 28 as an etching mask, the silicon oxide film 26 exposed at the opening 30 is removed by reactive ion etching (RIE). A reactive gas comprising $CHF_3$, or $CF_4$ can be used for the reactive ion etching. As described above, when removing the silicon oxide film 26 by dry etching such as RIE, it is difficult to uniformly remove (etch) the silicon oxide film 26 within a plane. Therefore, in the present embodiment, the silicon oxide film 26 on the formation region of the semiconductor region 18 is completely removed by performing overetching on the silicon oxide film 26. Moreover, during overetching of the silicon oxide film 26, the nickel layer 24 is also exposed to an etching gas. However, by appropriately selecting a reactive gas, etching conditions, and the like, an etching effect on the nickel layer 24 can be virtually nullified. Therefore, the nickel layer 24 acquires an approximately uniform thickness in the range exposed at the opening 30 of the silicon oxide film 26.

Figure 7:
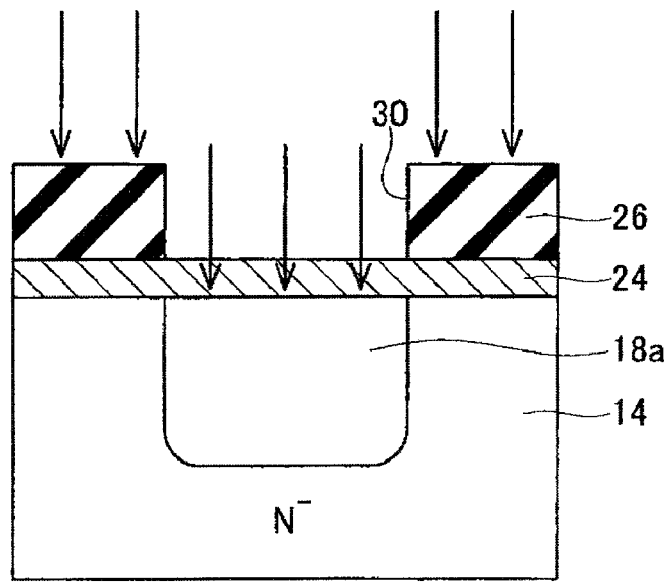
FIG. 7 is a diagram (sixth diagram) explaining the method for manufacturing the semiconductor device according to the first embodiment.

Next, as illustrated in FIG. 7, after the resist film 28 is removed, p type ion impurities (e.g., Al ions (aluminum ions)) are injected from above the drift layer 14 using the silicon oxide film 26 as a mask. In the range where the silicon oxide film 26 is formed, the injected p type ion impurities stop within the silicon oxide film 26 and are not injected into the drift layer 14. On the other hand, in the range where the silicon oxide film 26 is not formed, the injected p type ion impurities pass through the nickel layer 24 and are injected into the drift layer 14. As described above, since the nickel layer 24 has the approximately uniform thickness in the range where the opening 30 is formed, variations of a stop depth of the injected p type ion impurities in the plane can be suppressed. In addition, a part of the injected p type ion impurities (Al ions) collides with nickel atoms in the nickel layer 24 and causes a phenomenon (a so-called knock-on phenomenon) in which a part of the collided nickel atoms are injected into the drift layer 14.

Figure 9:
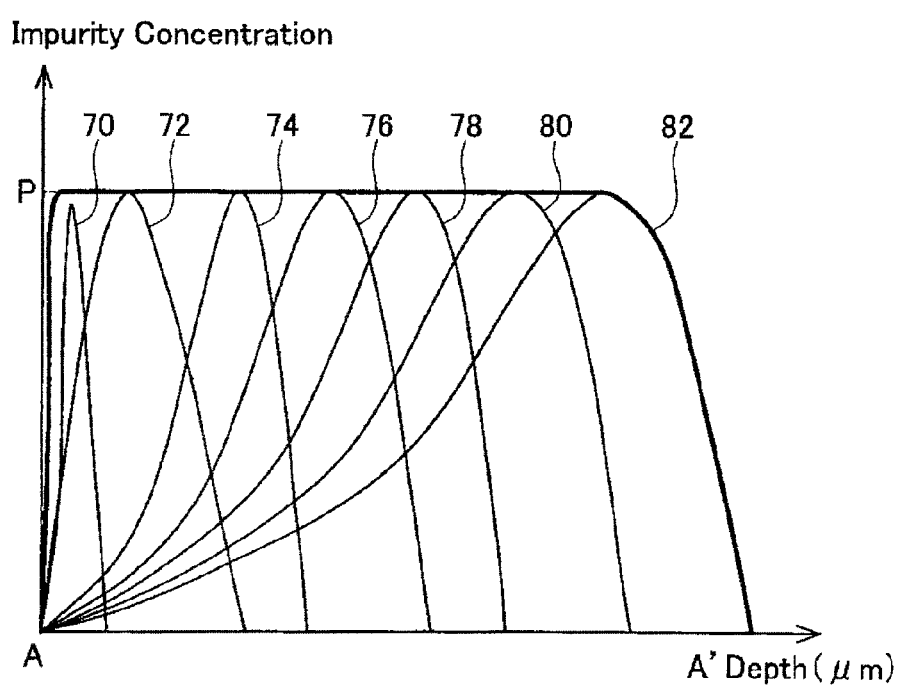
FIG. 9 is a diagram for explaining ion injections performed a plurality of times in an impurity injection step, wherein a vertical direction represents a concentration value of injected impurities and a horizontal direction represents a distance from an upper surface of a semiconductor layer.

Moreover, with a SiC semiconductor device, since a thermal diffusion coefficient is small, ion injection is performed a plurality of times while varying the injection energy of p type ion impurities in order to foam the semiconductor region 18 to a predetermined depth range from the surface of the drift layer 14. Specifically, as illustrated in FIG. 9, by performing a multi-stage (e.g., seven stages (reference numerals 70 to 82)) ion injection in which peak concentration values vary in a depth direction by varying the injection energy, the semiconductor region 18 with the impurity concentration that is constant in the depth direction is formed. Therefore, in order to form the semiconductor region 18 with the desired p type impurity concentration (e.g., $1.0 \times 10^{19}$ cm$^{-3}$) to a desired depth (e.g., 0.6 μm), a dose amount of ion impurities for each ion injection is to be determined so that the concentration value P represented by an ordinate of a graph illustrated in FIG. 9 is set to $1.0 \times 10^{19}$ cm$^{-3}$ and the injection energy for each ion injection is to be determined so that a depth A' represented by an abscissa of the graph illustrated in FIG. 9 is set to 0.6 μm. Accordingly, p type ion impurities are injected in a region indicated by reference character 18a in FIG. 7.

Figure 8:
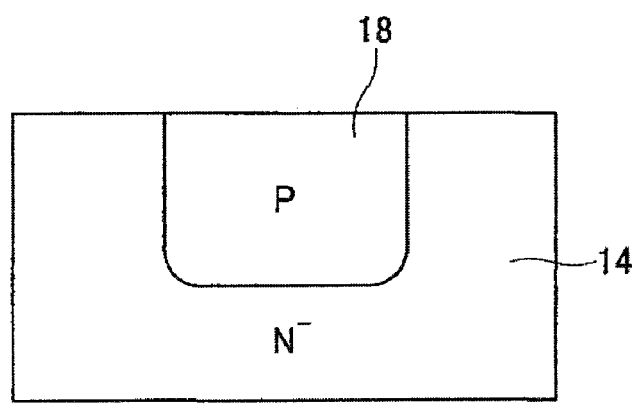
FIG. 8 is a diagram (seventh diagram) explaining the method for manufacturing the semiconductor device according to the first embodiment.

Subsequently, the remainders of the silicon oxide film 26 and the nickel layer 24 are sequentially removed by wet etching and an activation treatment (e.g., annealing process) is performed at a temperature of 1000° C. or higher (e.g., 1600° C.). Accordingly, as illustrated in FIG. 8, a region injected with p type ion impurities becomes the p type semiconductor region 18. Moreover, as described above, performing impurity injection through the nickel layer 24 results in nickel atoms also being injected into the semiconductor region 18. Therefore, by performing the activation treatment, the nickel atoms in the semiconductor region 18 are to be silicided. Accordingly, on resistance between the semiconductor region 18 and the front electrode 22 is reduced and ohmic contact characteristics between the semiconductor region 18 and the front electrode 22 are improved.

Once the semiconductor region 18 is formed on the drift layer 14, next, the guard ring 20 (e.g., having a p type impurity concentration of $4.0 \times 10^{17}$ cm$^{-3}$ and a film thickness of 0.6 μm) is formed. The guard ring 20 can be formed using methods similar to what is conventional. For example, a silicon oxide film is formed on the upper surface of the drift layer 14 and the silicon oxide film is patterned by photolithography. Next, ion impurities are injected into the drift layer 14 using the patterned silicon oxide film as a mask. The guard ring is formed by removing the silicon oxide film and subjecting the injected ion impurities to an activation treatment at a high temperature of 1000° C. or higher. Moreover, as is apparent from the above description, since a silicon oxide film is directly formed on the upper surface of the drift layer 14 when forming the guard ring 20, a difference in level is formed between the upper surface of the drift layer 14 and an upper surface of the guard ring 20. However, the guard ring 20 may be formed using a similar method as the method for forming the semiconductor region 18 described above. Accordingly, a difference in level can be prevented from forming between the upper surface of the drift layer 14 and the upper surface of the guard ring 20.

Next, a sputtering system is used to form a metallic layer (e.g., a nickel layer) on a rear surface of the wafer substrate 12, and the metallic layer (Ni layer) is silicided by an annealing process at a temperature of 800° C. or higher (e.g., 1000° C.). Accordingly, the back electrode 16 is formed on the rear surface of the wafer substrate 12. An insulating film (not shown) is then formed over the entire front surface of the drift layer 14 and an opening is formed on the insulating film. Next, a Schottky electrode (e.g., molybdenum) is deposited using a vacuum evaporation system on the surfaces of the drift layer 14, the semiconductor region 18, and the guard ring 20 exposed at the opening, and an aluminum electrode is deposited on the Schottky electrode. Accordingly, the front electrode 22 is formed.

Figure 18:
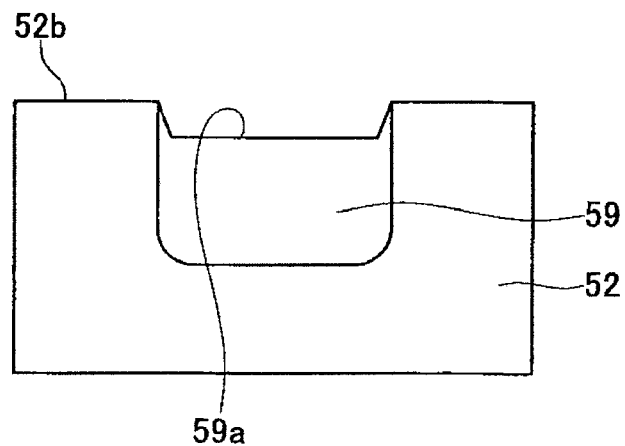
FIG. 18 is a diagram (third diagram) explaining the conventional manufacturing method.
Figure 19:
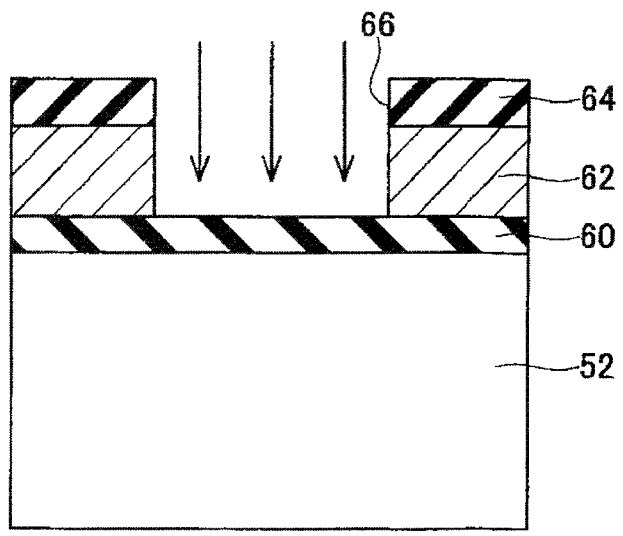
FIG. 19 is a diagram explaining another conventional manufacturing method.

As described above, with the manufacturing method according to the present embodiment, a difference in level is not created between the upper surface 14a of the drift layer 14 and the upper surface 18a of the semiconductor region 18, and the upper surface 18a of the semiconductor region 18 can be smoothly formed. Therefore, the generation of a leakage current when a reverse voltage is applied to the semiconductor device 10 can be effectively suppressed. Specifically, when a difference in level is created between the upper surface 14a of the drift layer 14 and the upper surface 18a of the semiconductor region 18 (as illustrated in FIG. 18) or on the upper surface 18a of the semiconductor region 18, a field concentration occurs at an edge of the difference in level and increases the leakage current. However, with the semiconductor device 10 manufactured by the manufacturing method according to the present embodiment, since the difference in level is not created between the upper surface 14a of the drift layer 14 and the upper surface 18a of the semiconductor region 18, and the upper surface 18a of the semiconductor region 18 is smoothly formed, generation of a leakage current can be effectively suppressed.

In addition, with the manufacturing method according to the present embodiment, since the nickel layer 24 has an approximately uniform thickness during injection of the ion impurities, variations of the stop depth of the injected p type ion impurities in the plane can be suppressed. Accordingly, variations of the semiconductor region 18 in the depth direction can be suppressed and characteristics of the semiconductor device 10 can be stabilized.

Furthermore, with the manufacturing method according to the present embodiment, since the injection of ion impurities through the nickel layer 24 causes the nickel atoms injected into the semiconductor region 18 to be silicided, an on resistance between the semiconductor region 18 and the front electrode 22 is reduced and ohmic contact characteristics between the semiconductor region 18 and the front electrode 22 are improved. Accordingly, large currents can be applied to the semiconductor device 10.

Second Embodiment

A manufacturing method according to a second embodiment of the present teachings will now be described using, as an example, a case of manufacturing the semiconductor device 10 described above. The manufacturing method according to the second embodiment differs from the manufacturing method according to the first embodiment solely by a procedure of forming a semiconductor region 18 on a drift layer 14. As such, only a procedure of manufacturing a semiconductor region on the drift layer 14 will be described.

Figure 10:
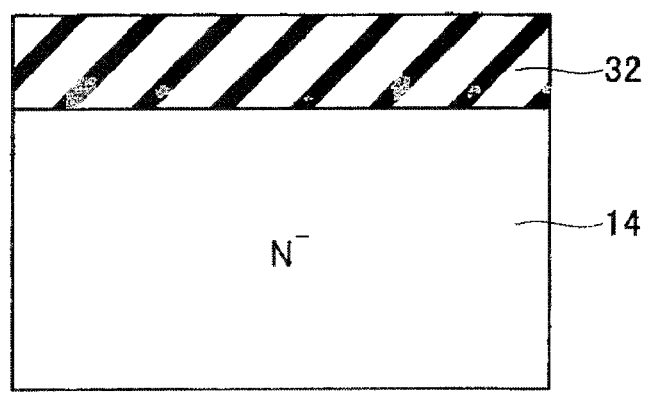
FIG. 10 is a diagram (first diagram) explaining a method for manufacturing a semiconductor device according to a second embodiment.
Figure 11:
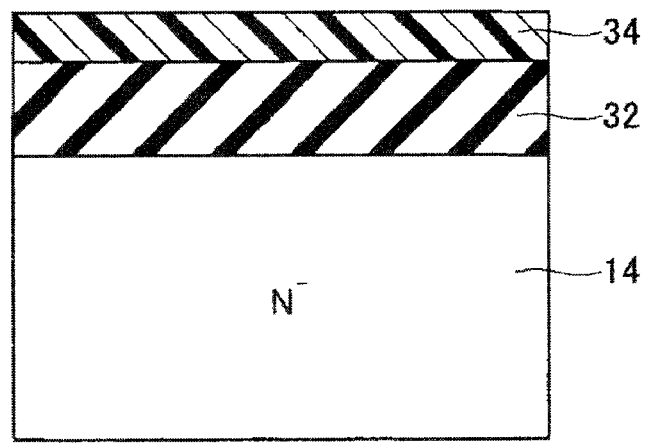
FIG. 11 is a diagram (second diagram) explaining the method for manufacturing the semiconductor device according to the second embodiment.
Figure 12:
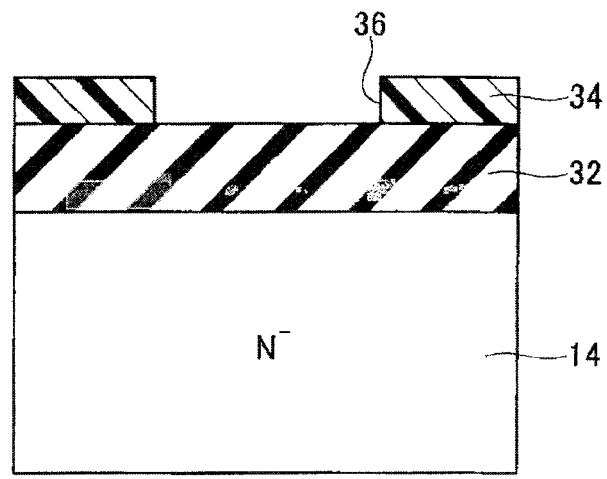
FIG. 12 is a diagram (third diagram) explaining the method for manufacturing the semiconductor device according to the second embodiment.

In the manufacturing method according to the second embodiment, as illustrated in FIG. 10, a silicon oxide film 32 (e.g., having a thickness of 2.0 μm) is formed on an upper surface of the drift layer 14. Next, as illustrated in FIG. 11, a resist film 34 is formed on a surface of the silicon oxide film 32. Subsequently, as illustrated in FIG. 12, a pattern corresponding to a semiconductor region 18 is patterned onto the resist film 34 by photolithography.

Figure 13:
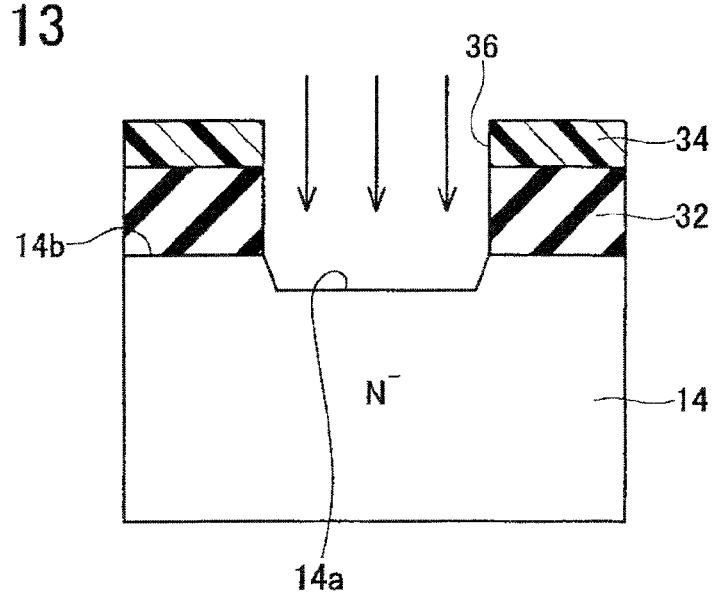
FIG. 13 is a diagram (fourth diagram) explaining the method for manufacturing the semiconductor device according to the second embodiment.

Next, as illustrated in FIG. 13, using the resist film 34 as an etching mask, the silicon oxide film 32 exposed at an opening 36 is removed by reactive ion etching (RIE) using a reactive gas such as $CHF_3$ and $CF_4$. In doing so, the silicon oxide film 32 on the formation region of the semiconductor region 18 is completely removed by performing overetching on the silicon oxide film 32. Moreover, since overetching is performed on the silicon oxide film 32, the drift layer 14 is also subjected to etching. As a result, a difference in level is formed between an upper surface 14b of a part covered by the silicon oxide film 32 and an upper surface 14a of a part exposed to the opening 36 among the drift layer 14.

Figure 14:
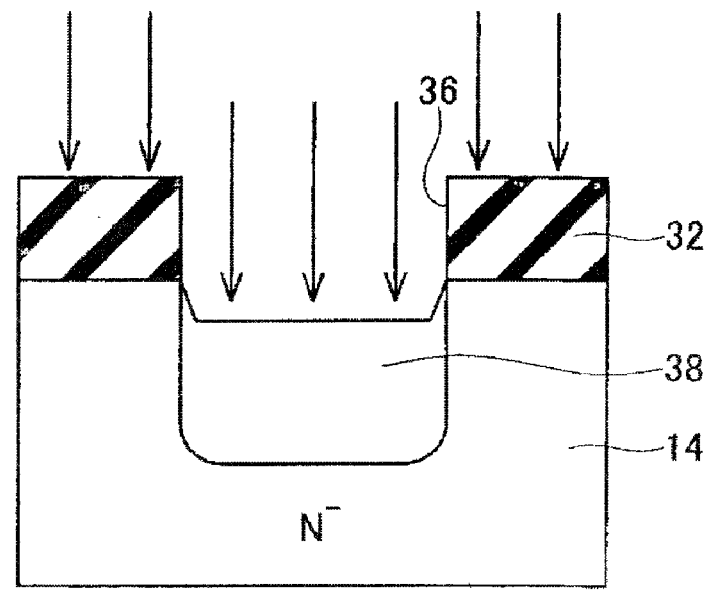
FIG. 14 is a diagram (fifth diagram) explaining the method for manufacturing the semiconductor device according to the second embodiment.

Next, as illustrated in FIG. 14, the resist film 34 is removed and p type ion impurities (e.g., Al ions) are injected from above the drift layer 14 using the silicon oxide film 32 as a mask. In the range where the silicon oxide film 32 is formed, the irradiated p type ion impurities stop within the silicon oxide film 32, and in the range where the silicon oxide film 26 is not formed, the injected p type ion impurities are injected into the drift layer 14. P type ion impurities are injected by performing a plurality of ion injection processes at respectively different injection energy in the same manner as in the first embodiment described above. In FIG. 14, a region indicated by reference numeral 38 is the region injected with the p type ion impurities.

Figure 15:
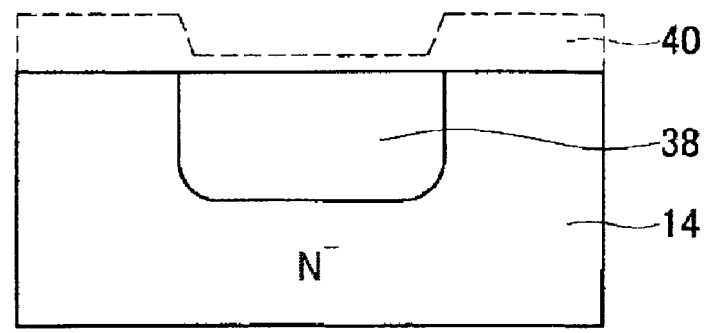
FIG. 15 is a diagram (sixth diagram) explaining the method for manufacturing the semiconductor device according to the second embodiment.
Figure 16:
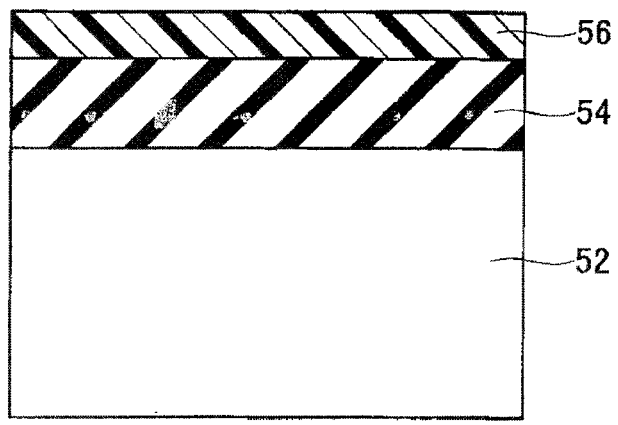
FIG. 16 is a diagram (first diagram) explaining a conventional manufacturing method.
Figure 17:
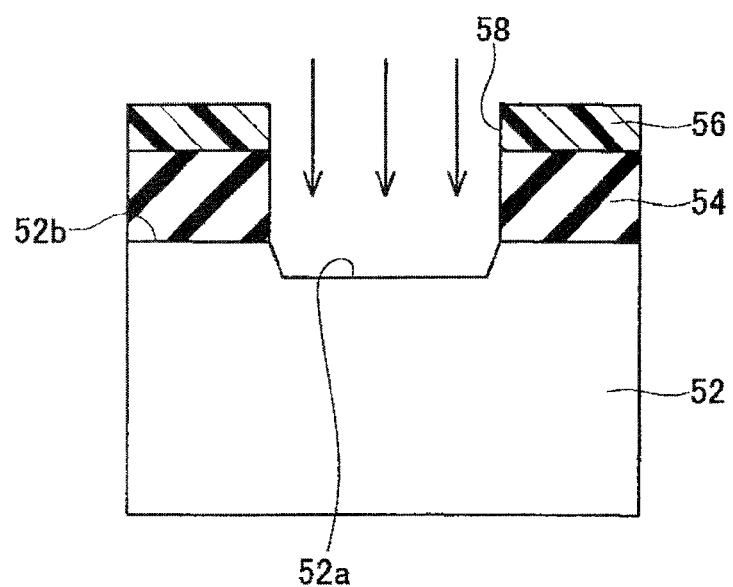
FIG. 17 is a diagram (second diagram) explaining the conventional manufacturing method.

Next, the remaining silicon oxide film 32 is removed by wet etching and, as illustrated in FIG. 15, the surface of the drift layer 14 is then smoothed by CMP (i.e., Chemical Mechanical Polishing). Accordingly, a surface layer part 40 of the drift layer 14 is removed, the difference in level between the drift layer 14 and the region 38 is eliminated, and the upper surface of the region 38 is smoothed. The surface layer part 40 of the drift layer 14 is susceptible to damage by a dry etching process for etching the silicon oxide film 32 and an ion injection process for injecting p type ion impurities. Since the surface layer part 40 damaged by the dry etching process and/or the ion injection process is removed by CMP, characteristics (e.g., leakage current characteristics) of the semiconductor device 10 can be improved.

Once the surface of the drift layer 14 is smoothed, an activation treatment (i.e., annealing process) is performed at a temperature of 1000° C. or higher (e.g., 1600° C.). Accordingly, the region 38 injected with the p type ion impurities becomes the p type semiconductor region 18. Subsequently, a guard ring 20, a back electrode 16, and a front electrode 22 are formed in the same manner as in the first embodiment.

Even with the manufacturing method according to the second embodiment, a difference in level is not created between the upper surface 14a of the drift layer 14 and the upper surface 18a of the semiconductor region 18, and the upper surface 18a of the semiconductor region 18 can be smoothly formed. Therefore, the generation of a leakage current when a reverse voltage is applied to the semiconductor device 10 can be effectively suppressed. In particular, since the surface layer part 40 damaged by dry etching and ion injection is removed, generation of leakage current can be effectively suppressed.

Moreover, with the manufacturing method according to the second embodiment, the surface layer part 40 of the drift layer 14 is removed after ion injection. Therefore, during ion injection, ion impurities can be prevented from being injected to the surface layer part 40 of the drift layer 14. Specifically, ion impurities are to be injected from a position deeper than the surface layer part 40 to be removed. Accordingly, wasteful injections of ion impurities are not performed and ion impurity injection processes can be shortened. For example, among the ion injection processes 70 to 82 illustrated in FIG. 9, the ion injection processes 70 and 72 for injection to the surface layer part 40 of the drift layer 14 can be omitted.

In addition, in the manufacturing method according to the second embodiment, the silicon oxide film 32 is formed on an upper surface of the drift layer 14 and the silicon oxide film 32 is used as an ion injection mask. However, the ion injection mask is not limited to the silicon oxide film 32 and any film may be used as long as the film is capable of shielding p type ion impurities (e.g., Al ions).

The preferred embodiments of the present teachings have been described above, the explanation was given using, as an example, the present teachings is not limited to this type of configuration.

For example, while a case of manufacturing the junction barrier Schottky diode has been described in the above embodiments, the manufacturing method according to the present teachings is not limited to such a semiconductor device. The manufacturing method according to the present teachings can be applied to any semiconductor device as long as the semiconductor device includes a second conductive type semiconductor region formed on a first conductive type semiconductor layer, wherein the semiconductor region is exposed at a surface of the first conductive type semiconductor layer. For example, the manufacturing method according to the present teachings is applicable to a SiC semiconductor device in which is formed a device structure such as a field-effect transistor (e.g., a MOSFET, a junction field effect transistor, and the like). In addition, the manufacturing method according to the present teachings is also applicable to a case where an n type semiconductor region is formed on a p type semiconductor layer.

Finally, although the preferred representative embodiments have been described in detail, the present embodiments are for illustrative purpose only and not restrictive. It is to be understood that various changes and modifications may be made without departing from the spirit or scope of the appended claims. In addition, the additional features and aspects disclosed herein also may be utilized singularly or in combination with the above aspects and features.

What is claimed is:

1. A method for manufacturing a semiconductor device including a first conductive type semiconductor layer composed of silicon carbide, the first conductive type semiconductor layer having a second conductive type semiconductor region exposed at an upper surface of the first conductive type semiconductor layer, the method comprising steps of:

forming a first layer on the upper surface of the first conductive type semiconductor layer, the first layer being made of Ni or an alloy including Ni;

forming a second layer on the upper surface of the first layer, the second layer being made of silicon oxide;

removing a part of the second layer, the part corresponding to a position of the second conductive type semiconductor region;

after the removing step injecting second conductive type ion impurities through the removed part of the second layer, through a portion of the first layer that is below the removed part of the second layer, and into the first conductive type semiconductor layer, thus forming the second conductive type semiconductor region; and removing the first and second layers after the injecting step.

2. The method as in claim 1, wherein the first conductive type semiconductor layer is an n type semiconductor layer, the second conductive type semiconductor region is a p type semiconductor region, and the second conductive type ion impurities are Al ions.

3. The method as in claim 2, further comprising a step of activating the second conductive type ion impurities injected into the first conductive type semiconductor layer by annealing the first conductive type semiconductor layer.

4. The method as in claim 3, wherein a thickness of the first layer is equal to 100 nm or less than 100 nm.

5. The method as in claim 4, wherein the first layer is made of Ni or a Ni—Mo alloy.

6. The method as in claim 5, wherein, in the removing step, the part of the second layer is removed by reactive ion etching.

7. The method as in claim 6, wherein the part of the second layer is removed by performing etching on the second layer in the removing step.

8. The method as in claim 1, wherein a thickness of the first layer is equal to 100 nm or less than 100 nm.

9. The method as in claim 8, wherein the part of the second layer is removed by performing etching on the second layer in the removing step.

* * * * *